(12) United States Patent
Perner et al.

(10) Patent No.: US 6,717,874 B1
(45) Date of Patent: Apr. 6, 2004

(54) SYSTEMS AND METHODS FOR REDUCING THE EFFECT OF NOISE WHILE READING DATA IN SERIES FROM MEMORY

(75) Inventors: Frederick A. Perner, Palo Alto, CA (US); David H. McIntyre, Boise, ID (US); Jonathan Jedwab, London (GB); Anthony P. Holden, Boise, ID (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/218,892

(22) Filed: Aug. 14, 2002

(Under 37 CFR 1.47)

(51) Int. Cl.⁷ .............................................. G11C 7/02
(52) U.S. Cl. .................................. 365/206; 365/189.01
(58) Field of Search ............................. 365/206, 189.01

(56) References Cited

U.S. PATENT DOCUMENTS

| | | | | |
|---|---|---|---|---|
| 5,282,166 A | * | 1/1994 | Ozaki | 365/203 |
| 6,188,615 B1 | | 2/2001 | Perner et al. | 365/189.01 |
| 6,191,972 B1 | | 2/2001 | Miura et al. | 365/171 |
| 6,256,224 B1 | | 7/2001 | Perner et al. | 365/173 |

OTHER PUBLICATIONS

Scheuerlein, Roy; Gallagher, William; Parkin, Stuart; Lee, Alex; Ray. Sam; Robertazzi, Ray; Reohr, William, "A 10ns Read and Write Non–Volatile Memory Array Using a Magnetic Tunnel Junction and FET Switch in each Cell" 2000 IEEE International Solid–State Circuits Conference, 8 pgs.

Durlan, M.; Naji, P.,; DeHerrera, M.; Tehraniu, S.; Kerszykowski, G., Kyler, K., "Nonvolatile RAM based on Magnetic Tunnel Junction Elements", 2000 IEEE International Solid–State Circuits Conference, 7 pgs.

* cited by examiner

*Primary Examiner*—M. Tran

(57) ABSTRACT

Systems and methods for reducing the effect of noise while reading data in series from memory, are provided. One system embodiment comprises a memory cell that stores a first data; a sensing device that receives the first data multiple times and provides a first set of outputs; and a voting system that evaluates the first set of outputs to determine whether one of the outputs of the first set is valid data from the memory cell. One method embodiment comprises reading data in series that is stored in a memory cell to provide outputs; and evaluating the outputs to determine whether one of the outputs is valid data from the memory cell.

24 Claims, 9 Drawing Sheets

SYSTEMS AND METHODS FOR REDUCING THE EFFECT OF NOISE WHILE READING DATA IN SERIES FROM MEMORY

TECHNICAL FIELD

The present invention is generally related to memory in the computer arts and, more particularly, is related to systems and methods for reducing the effect of noise while reading data in series from memory.

BACKGROUND OF THE INVENTION

Magneto-resistive devices such as a magnetic random access memory (MRAM) device and a write-once memory device store data. The magneto-resistive devices include memory cells and each memory cell stores a data "1" or a data "0". Each memory cell of the magneto-resistive device includes a soft layer that is located above or below a tunneling junction and a hard layer that is located opposite to the soft layer.

Typically, a high gain sense amplifier is used to read data from each memory cell of the magneto-resistive device. Unfortunately, the high gain sense amplifier is subject to noise while reading the data since the high gain sense amplifier is built from circuits that are subject to alternating current (AC) noise, power supply noise, coupled digital switching noise, and noise associated with small area of the magneto-resistive device.

Signal-to-noise ratio (SNR) of the high gain sense amplifier is optimized to offset the effect of the noise to which the high gain sense amplifier is subject. Optimization of the SNR generally results in increased costs or being unable to meet SNR specifications of the computer arts since noise-reduction techniques are used to optimize the SNR of the high gain sense amplifier. Examples of noise-reduction techniques include low noise design and physical layout techniques. Noise reduction techniques often result in increased costs because of increased complexity of a circuit executing one of the noise-reduction techniques, increased physical area occupied by the circuit, or increased cost of executing one of the noise-reduction techniques.

A need exists in the industry to overcome the above-mentioned inadequacies of increased costs or failure to meet the SNR specifications, or other inadequacies or deficiencies.

SUMMARY OF THE INVENTION

The present invention provides systems and methods for reducing the effect of noise while reading data in series from memory.

Briefly described, in architecture, one embodiment of the system can be implemented as follows: a memory cell that stores a first data; a sensing device that receives the first data multiple times and provides a first set of outputs; and a voting system that evaluates the first set of outputs to determine whether one of the outputs of the first set is valid data from the memory cell.

The present invention can also be viewed as providing methods for reducing the effect of noise while reading data from memory. In this regard, one embodiment of such a method, among others, can be broadly summarized by the following steps: reading data in series that is stored in a memory cell to provide outputs; and evaluating the outputs to determine whether one of the outputs is valid data from the memory cell.

BRIEF DESCRIPTION OF THE DRAWINGS

Many aspects of the invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

DETAILED DESCRIPTION

Noise-reducing systems and methods are provided that reduce the effect of noise that is created when data is read in series by a sensing device from a memory cell in a magneto-resistive device. The noise-reducing systems and methods reduce the effect of the noise without optimizing the signal-to-noise (SNR) of a sense amplifier, thereby avoiding the inadequacies of increased costs or being unable to meet the SNR specifications. As described below, the noise-reducing systems and methods reduce the effect of noise by reading data in series that is stored in the memory cell, determining by using one of various techniques whether data stored in the memory cell of the magneto-resistive device is a data "1" or a data "0", and evaluating the results of one of the various techniques to determine whether data from the memory cell is valid data. The various techniques include a triple-sample technique, a non-destructive read technique, a technique using a differential amplifier, and a bit-bit bar scheme. Hence, the noise-reducing systems and methods reduce the impact of the noise without optimizing the SNR of a sense amplifier. It is noted that the noise-reducing systems and methods can be used with an optimized sense amplifier to meet the SNR specifications with a minimal increase in costs.

Figure 1A:
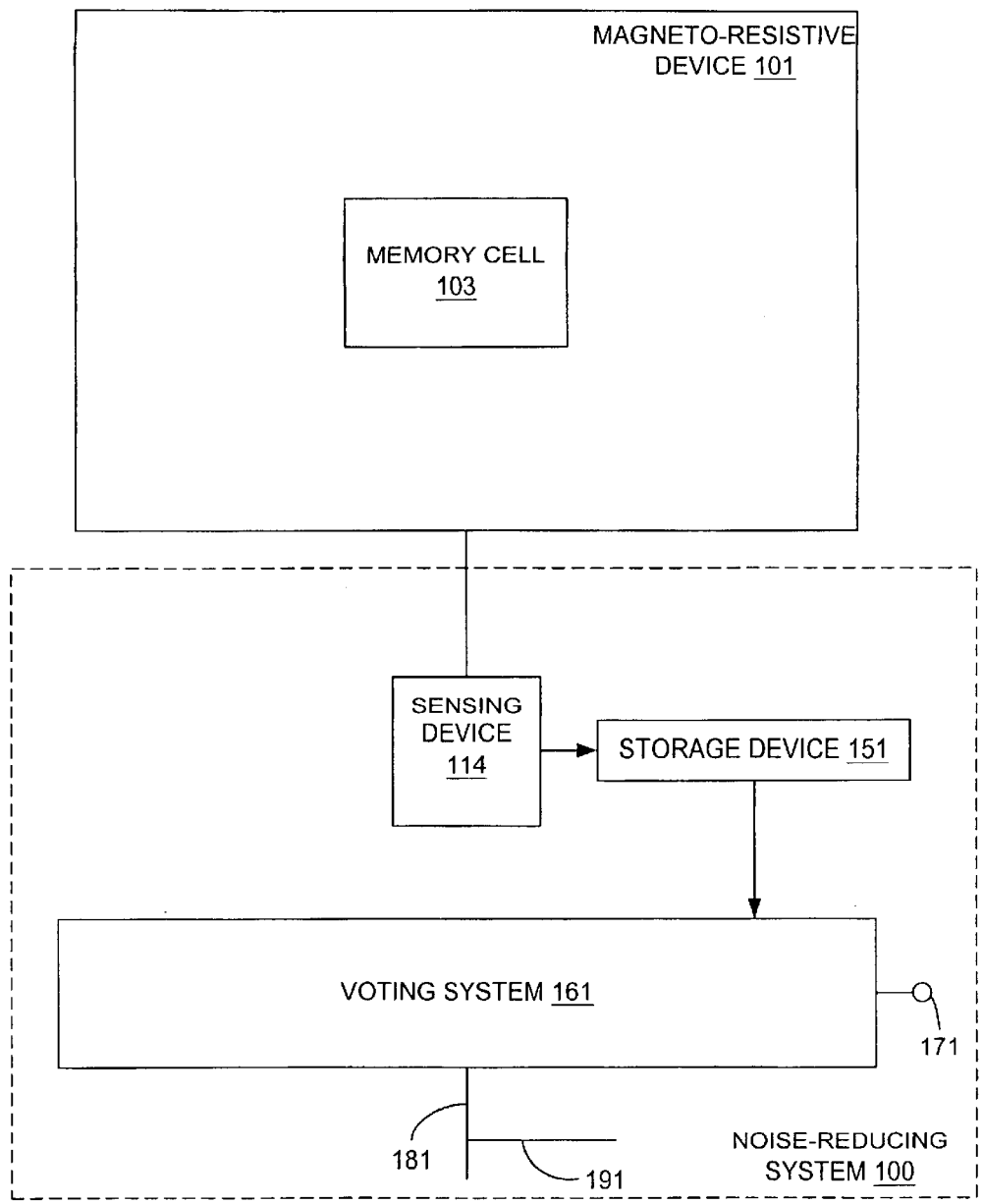
FIG. 1A is a block diagram of an embodiment of a system as used with a magneto-resistive device, where the system reduces the effect of noise while reading data in series from the magneto-resistive device.

FIG. 1A is a block diagram of an embodiment of a noise-reducing system 100, as used with a magneto-resistive device 101, where the system reduces the effect of noise while reading data in series stored in a magneto-resistive device 101. Examples of a magneto-resistive device include a magnetic random access memory (MRAM), and a write-once memory. The noise-reducing system 100 includes a sensing device 114, a storage device 151, and a voting system 161. The sensing device can be a sense amplifier, or any other device that senses data from a memory cell. The storage device 151 can be, for instance, an n-bit shift register, where n is an integer. As illustrated in FIG. 1A, the magneto-resistive device 101 includes a memory cell 103 that stores data. Although only one such cell 103 is indicated, it is to be understood that the magneto-resistive device 101 normally will include a multiplicity of these cells.

The sensing device 114 reads data from one of the memory cells, e.g., memory cell 103, of the magneto-resistive device 101. As is discussed in greater detail below, the sensing device 114 performs, for example, the triple-sample technique to determine whether the data read is a data "1" or a data "0", and provides an output which is a data "0" or a data "1". The voting system 161, which can be implemented as software, hardware, firmware, or a combination thereof, evaluates the outputs to determine whether one of the outputs is valid data. Valid data is conveyed as output over a line 181 and may be written back to the memory cell from which the sensing device 114 reads data. Invalid data may be further processed by an error-correction circuitry (not shown) to provide valid data that may be written back to the memory cell. Any write back to the memory cell is via a line 191. Output at a node 171 is an error flag from the evaluation to indicate whether the data output over the line 181 is valid.

Figure 1B:
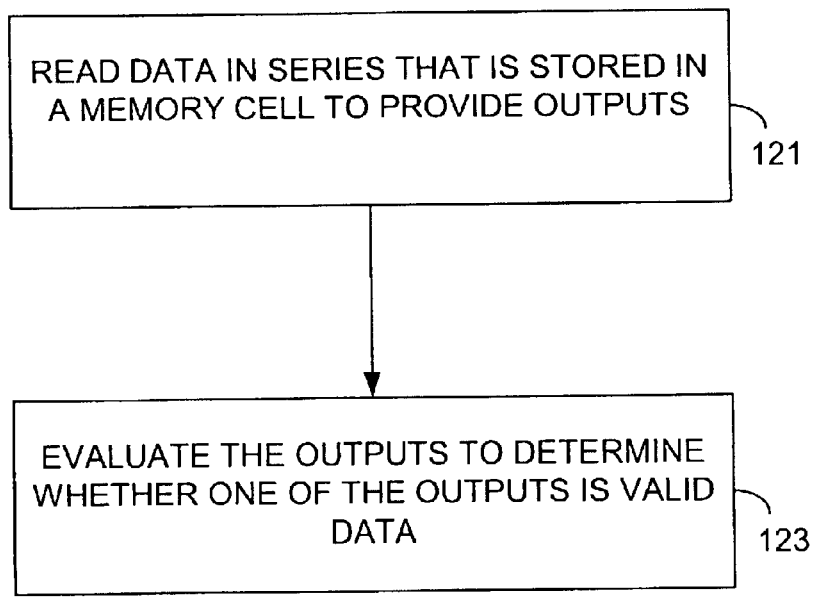
FIG. 1B is a high-level flowchart of an embodiment of a method for reducing the effect of noise while reading data in series from the magneto-resistive device shown in FIG. 1A.

FIG. 1B is a high-level flowchart of an embodiment of a method for reducing the effect of noise while reading data in series that is stored in the magneto-resistive device 101 (FIG. 1A). In step 121, the sensing device 114 (FIG. 1A) reads data in series that is stored in the memory cell 103 (FIG. 1A) to provide outputs. The sensing device 114 reads data from the memory cell 103 multiple times, thereby reading the data in series to provide outputs. Comparatively, data can be read in parallel from the memory cell 103 by coupling multiple sensing devices (not shown) to the memory cell 103. Each sensing device can be coupled via a line to the memory cell 103 and all the sensing devices can be coupled via one line to the voting system 161 (FIG. 1A). The sensing devices read data in parallel by simultaneously reading data from the memory cell 103 to provide outputs that are then evaluated by the voting system 161.

The number of times the sensing device 114 reads data in series to provide outputs is the same as the storage capacity of the storage device 151 because the number of times the sensing device 114 reads data in series from the memory cell 103 is the same as the number of outputs of the sensing device 114, and the number of outputs of the sensing device 114 is the same as the storage capacity of the storage device 151. For example, if the storage device 114 is an n-bit shift register, the number of times the sensing device 114 reads data in series from the memory cell 103 to provide outputs is n, where n is an integer greater than zero. In step 123, the voting system 161 (FIG. 1A) evaluates the outputs to determine whether one of the outputs is valid data from the memory cell (FIG. 1A).

Figure 2:
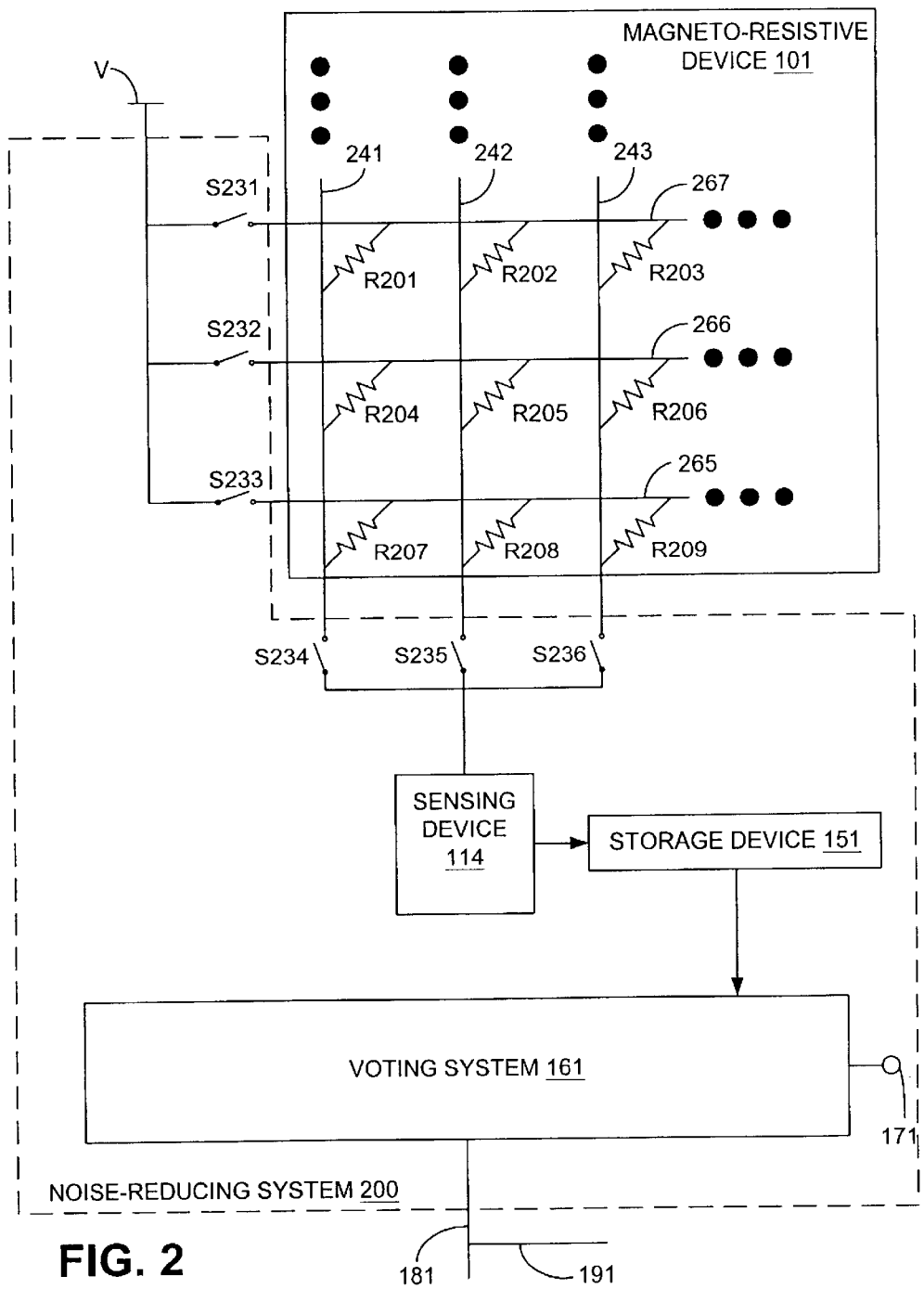
FIG. 2 is a block diagram of another embodiment of a system as used with a magneto-resistive device, where the system reduces the effect of noise while reading data in series from the magneto-resistive device.

FIG. 2 is a block diagram of another embodiment of a noise-reducing system 200 as used with the magneto-resistive device 101, where the system 200 reduces the effect of noise while reading data stored in the magneto-resistive device. The noise-reducing system 200 includes switches S231–S236, the sensing device 114, and the voting system 161.

The magneto-resistive device 101 includes word lines 265–267 and bit lines 241–243. The word lines and the bit lines transport data stored in memory cells. Memory cells are located at intersections of the word lines and the bit lines. For instance, a memory cell, represented by a resistor R201, is located at the intersection of the word line 267 and the bit line 241. Resistors R202–R209 represent resistances of various memory cells that the magneto-resistive device 101 includes. The magneto-resistive device 101 may include any number of word lines, bit lines, and memory cells. For instance, a 64×64 magneto-resistive device has 64 word lines, 64 bit lines, and 4096 memory cells. A 1024×1024 magneto-resistive device includes 1024 word lines, 1024 bit lines, and 1046576 memory cells.

In one embodiment, the sensing device 114 performs a triple sample technique on data that is read from one of the memory cells, e.g., resistors R201–R209, of the magneto-resistive device 101 to determine whether data read from one of the memory cells of the magneto-resistive device 101 is a data "1" or a data "0". The sensing device outputs a data "0" if it determines that data read from the memory cell is a data "0", and outputs a data "1" if it determines that data read from the memory cell is a data "1". In the first stage of the triple sample technique, data is read from one of the memory cells R201–R209. For example, the memory cell represented by resistor R205 is read by closing switches S232 and S235, and opening switches S231, S233, S234, and S236. Application of a potential V results in current flow through the memory cell, represented by resistor R205, to the sensing device 114. Generally, if the resistance of a memory cell is high, a low amount of current passes through the memory cell, while if the resistance of the memory cell is low, a high amount of current passes through the memory cell. The sensing device 114 senses whether a high or a low amount of current passes through the memory cell, thereby reading data that is stored in the memory cell.

In an alternative reading method, a memory cell, for instance, represented by the resistor R205, can be read by selecting the word line 266 using a decoder (not shown) and selecting the bit line 242. The decoder does not select the remaining word lines 265 and 267 or the remaining bit lines 241 and 243. The decoder can select the word line 266 by providing a different potential to the word line than a potential of the word lines 265 and 267. Similarly, the decoder can select the bit line 242 by providing a different potential to that bit line than a potential of the bit lines 241 and 243. For instance, a high potential can be provided to the bit line 242, while the bit lines 241 and 243 are provided with a low potential. Alternatively, the bit line 242 can be provided with a low potential, while the bit lines 241 and 243 are provided with a high potential.

In the second stage of the triple sample technique, a data "1" is written to the memory cell, e.g., that represented by resistor R205, from which data was read in the first stage, and then the memory cell is read. The data "1" is referred to as a reference "1". The sensing device 114 reads the memory cell after the reference "1" is written to the memory cell. Finally, in the third stage of the triple sample technique, a data "0" is written to the memory cell, e.g., that represented by resistor R205, from which data was read in the first stage, and then the data "0" is read from the memory cell by each of the sensing device 114. The data "0" is referred to as a reference "0". During the second and the third stages, data is read from the memory cell in the same manner as data was read from the memory cell during the first stage.

Next, the sensing device 114 compares the data that was read from the memory cell during the first stage to the reference "1" and to the reference "0" to determine whether the data that was read during the first stage is closer to the reference "1" or to the reference "0". The sensing device 114 then makes a decision based on the comparison and provides an output that is a data "1" or a data "0". The output is a data "1" if the data read during the first stage is closer to the reference "1", and the output is a data "0" if the data read during the first stage is closer to the reference "0". An example of a suitable triple sample technique is described in detail in U.S. Pat. No. 6,188,615, which is incorporated by reference herein in its entirety.

The triple sample technique is more reliable than a technique using a differential sense amplifier since in the triple sample technique, a reference "1" or a reference "0" is written to and read from the same memory cell from which data is read during the first stage of the triple sample technique. The writing and the reading of the reference "0" and the reference "1" from the same memory cell from which data is read during the first stage takes into consideration any unique properties of that memory cell. However, in case of the technique using a differential sense amplifier, data read from a memory cell is compared to a data "1" or a data "0" that is not written to and then read from the same memory cell, thereby not taking into account the properties of that memory cell.

The triple sample technique is also more reliable than a bit-bit bar sense scheme of a static random access memory (SRAM), where data is stored in two separate memory cells, one having a data "1" and the other having a data "0". However, it should be noted that the technique using a differential sense amplifier, the bit-bit bar sense scheme, or a non-destructive read technique could be used instead of the triple sampling technique, if desired. The technique using a differential sense amplifier, the bit-bit bar sense scheme, and the non-destructive read technique are known to people having ordinary skill in the art. A suitable technique that uses the bit-bit bar scheme is described in Scheuerlein R., et al., "A 10 ns Read and Write Non-Volatile Memory Array Using a Magnetic Tunnel Junction and FET Switch in Each Cell"; 2000 IEEE International Solid-State Circuits Conference, San Francisco, Calif., Feb. 7–9, 2000. A technique using a differential sense amplifier is described in Durlam, M., et al., "Nonvolatile RAM based on Magnetic Tunnel Junction Elements," 2000 IEEE International Solid-State Circuits Conference. Different kinds of non-destructive read techniques are described in U.S. Pat. No. 6,188,615.

The storage device 151 stores the outputs in a serial fashion. The storage device 151 can be an n-bit shift register that shifts data in and out serially, where n is an integer greater than zero. The outputs are transferred from the storage device 151 to the voting system 161.

The voting system 161 evaluates the outputs of the sensing device 114 to provide a result at a node 171 based on the evaluation. The result indicates the outcome of the evaluation and whether one of the outputs of the sensing device 114 is valid data that may be written back to the memory cell from which the sensing device 114 read data. Hence, the voting system 161 evaluates the outputs to determine whether one of the outputs of the sensing device 114 is valid. The voting system evaluates the outputs as follows. If all the outputs of the sensing device 114 are the same as each other, there is a consensus and the voting system 161 indicates the consensus at the node 171. The consensus is indicated in a first field of data at node 171. The first field is a one bit binary field which indicates a "1" if there is a consensus and a "0" if there is no consensus. For instance, if all the outputs of the sensing device 114 is a data "0", the voting system 161 outputs a "1" at the node 171 to indicate a consensus. Alternatively, the consensus may be indicated by a "0" and a "1" may indicate that there is no consensus. Moreover, in case of a consensus, the voting system 161 outputs over the line 181, one of the outputs of the sensing device 114. The output over the line 181 can be a data "1" or a data "0". For instance, if all the outputs of the sensing device 114 is a data "0", the voting system 161 outputs a data "0" over the line 181. A consensus implies that there is negligible noise in data read by the sensing device 114 from one of the memory cells of the magneto-resistive device 101, and so valid data, which is data with negligible noise, is output via the line 181, and may be written back to the memory cell via the line 191. The data output over the line 181 can be provided to external circuits (not shown).

If a majority of the outputs of the sensing device 114 are the same but a consensus is not reached, the voting system 161 outputs a "0" in the first field to indicate that a consensus is not reached, and a majority in a second field of data at node 171. The majority is a number that represents a difference between the total number of outputs of the sensing device 114 and a number that represents a minority of the outputs of sensing device 114 that are the same output as each other. To illustrate, assume that the sensing device 114 provides seven outputs. If four of the outputs of the sensing device 114 are a data "1", and the remaining three outputs of the sensing device 114 are a data "0", the voting system 161 outputs a "4" in the second field of the node 171. In such a case, the number "4" is the difference between the total number of outputs of the sensing device 114, i.e., seven, and the number of outputs of the sensing device 114 that are a data "0", i.e., three.

In the above example, if at least four of the seven outputs of the sensing device 114 are a data "1", a majority of the outputs of the sensing device 114 are the same as each other. Alternatively, if the sensing device 114 provides nine outputs, and if at least five of the outputs are a data "1", a majority of the outputs are the same as each other.

A majority implies that there is non-negligible noise in data read by the sensing device 114 from one of the memory cells of the magneto-resistive device 101, and data, which is any one of a majority of the outputs of the sensing device 114, is output over the line 181. Moreover, in case of a majority, one of a majority of the outputs of the sensing device 114 may not be written back to the memory cell. The data may be written back if an error-correction circuitry is used to verify or correct the data before writing back the data to the memory cell.

Whether the data output over the line 181 in case of a majority is valid data depends on the type of context that comprises the data. To cite a specific example, if data stored in the memory cell. e.g., resistor R205, is part of pictorial data and a majority of the outputs from a majority of the sensing device 114 are the same as each other, one of the majority of outputs of the sensing device 114 is presumed valid. The presumption is good since if the presumption is false and the memory cell outputs incorrect data, a small amount of incorrect data will not substantially affect the picture. In the context of pictorial data, data is output over the line 181 but may not be written back since if the presumption is false, data stored in the memory cell will not substantially affect the picture. For the same reasons, if data stored in the memory cell is part of acoustic data and a majority of outputs of the sensing device 114 are the same as each other, one of the majority of the outputs of the sensing device 114 is presumed valid and may not be written back to the memory cell. However, if data stored in the memory cell is a portion of accounting data, and if only a majority of the outputs of the sensing device 114 have the same output as each other, one of the majority of the outputs of the sensing device 114 is not presumed to be valid. The reason behind not presuming data to be valid is that is the presumption is false and the memory cell stored incorrect data, a small amount of incorrect data will substantially affect the account. For instance, if data stored in the memory cell is such that it represents an account of $200,000 to be $100,000, there is a substantial effect on the account. In the case of accounting data, data output over the line 181 can pass through an error-correction circuitry (not shown) and then may be written back to the memory cell.

Figure 3:
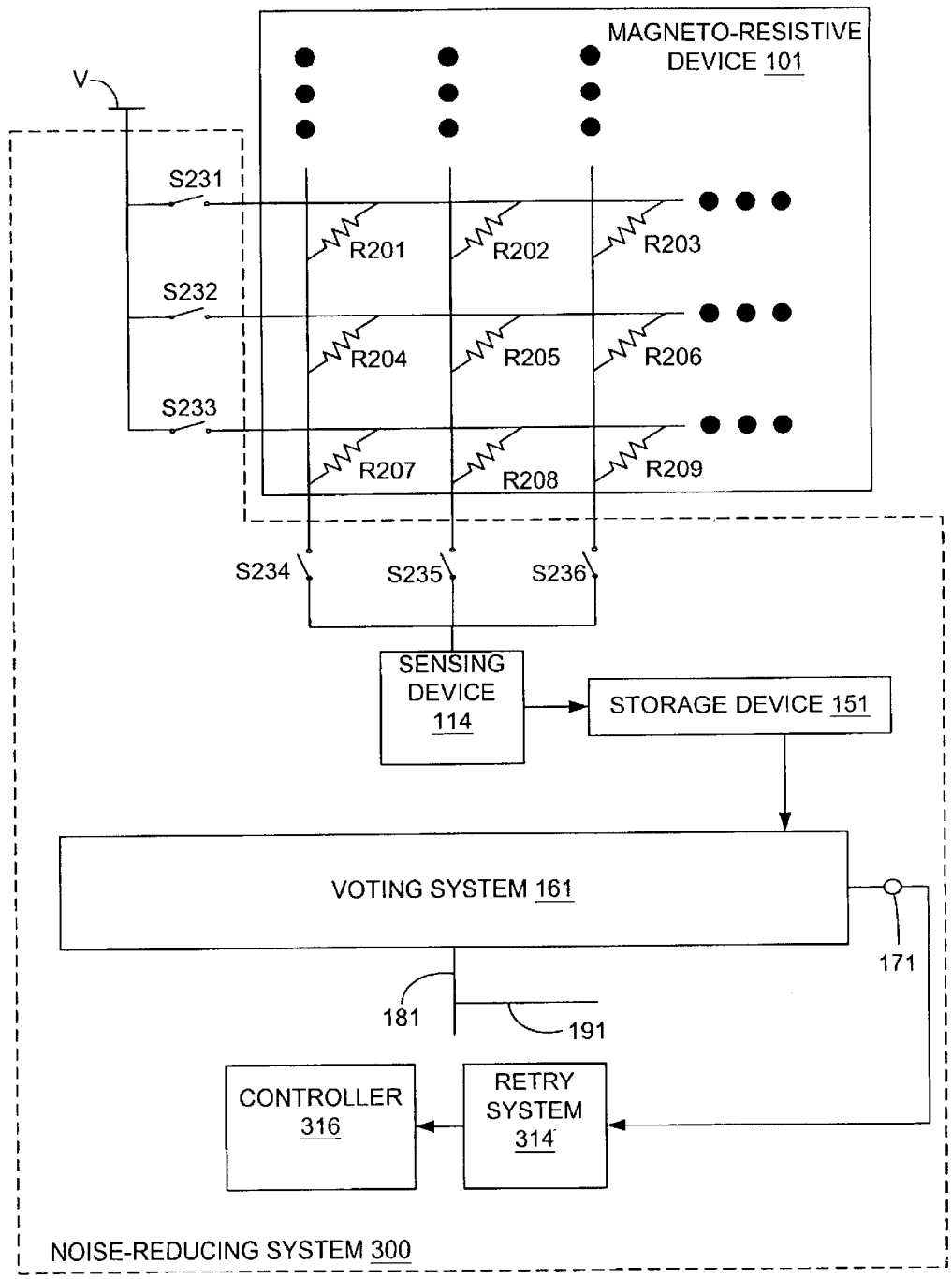
FIG. 3 is a block diagram of yet another embodiment of a system as used with a magneto-resistive device, where the system reduces the effect of noise while reading data in series from the magneto-resistive device.

FIG. 3 is a block diagram of yet another embodiment of a noise-reducing system 300 as used with the magneto-resistive device 101, where the system reduces the effect of noise while reading data stored in the magneto-resistive device. The noise-reducing system 300 of FIG. 3 is similar to the system 200 of FIG. 2 except the system of FIG. 3 includes a retry system 314 and a controller 316. It should be noted that, although shown as part of the system 300, the controller 316 can be comprised in the magneto-resistive device 101.

The retry system 314 obtains a result at the node 171 of the voting system 161 and determines whether the result is of an acceptable value. The acceptable value is a value that corresponds to a consensus. Alternatively, whether the acceptable value corresponds to a majority depends on a context that comprises the data. To cite a specific example, if data stored in the memory cell, e.g., resistor R205, is part of pictorial data and a majority of the outputs of the sensing device 114 are the same as each other, one of the majority of outputs of the sensing device 114 is presumed acceptable. The reason behind the presumption is that if the presumption is false and the memory cell stores incorrect data, a small amount of incorrect data will not substantially affect the picture. For the same reason, if data stored in the memory cell is part of acoustic data and a majority of the outputs of the sensing device 114 is the same as each other, one of the majority of the outputs of the sensing device 114 is presumed acceptable. However, if data stored in the memory cell is a portion of accounting data, and if only a majority of the outputs of the sensing device 114 are the same as each other, one of the majority of the outputs of the sensing device 114 is not presumed to be acceptable. A reason for not presuming one of the majority of the outputs data to be acceptable is that if the presumption is false and the memory cell stores incorrect data, a small amount of incorrect data will substantially affect the account.

If the result of the voting system 161 at the node 171 is not of an acceptable value, the retry system 314 commands the controller 316 to instruct the sensing device 114 to read data using a non-destructive read technique to provide outputs to the voting system 161. The data is read from the memory cell from which data was initially read to provide the result at the node 171. When the retry system 314 is used, data is initially read using a non-destructive read technique. The voting system 161 then evaluates the outputs to provide a result at the node 171 and an output over the line 181. The retry system 314 continues to command the controller 316 until result at the node 171 is of an acceptable value. If the result at the node 171 is of an acceptable value, the retry system 314 stops commanding the controller 316 and data is output over the line 181.

Figure 4:
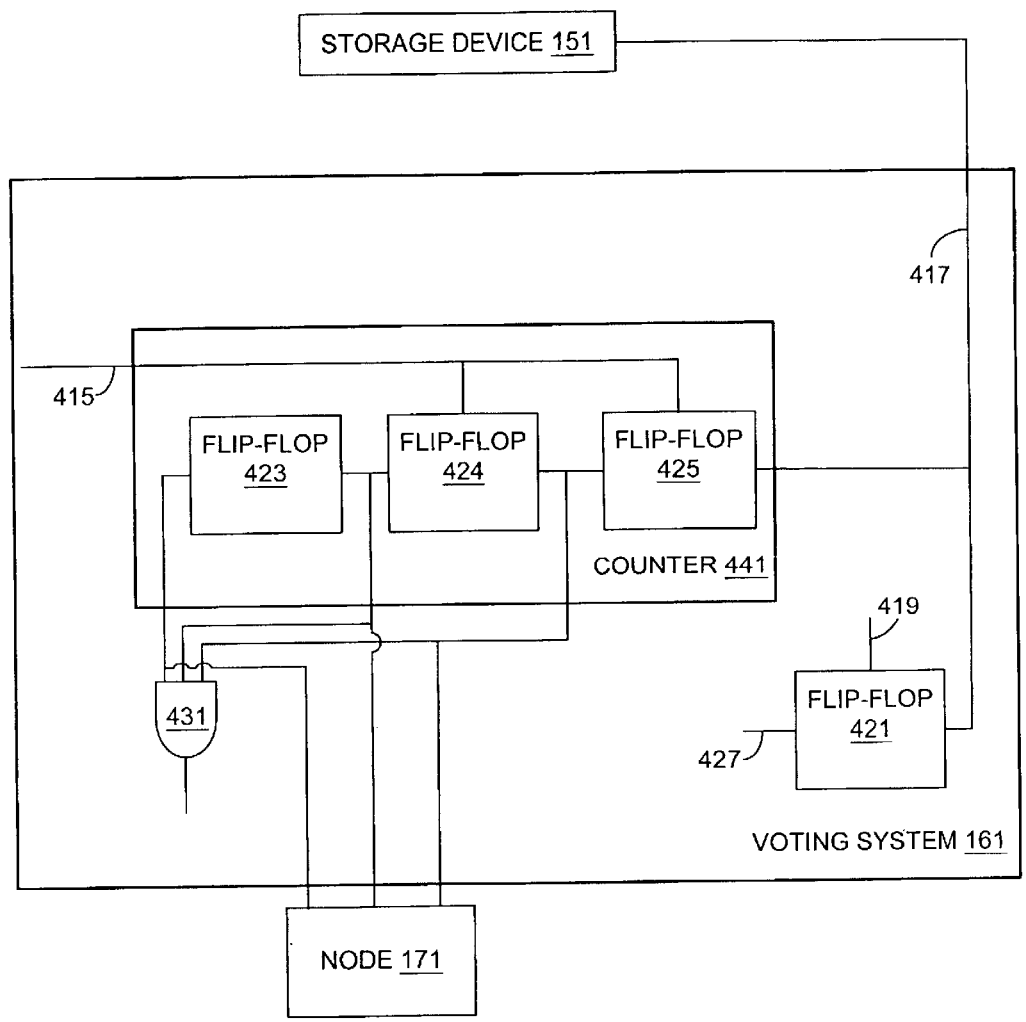
FIG. 4 is a block diagram of an embodiment of a voting system that can be used in the embodiments of FIGS. 1A, 2, and 3.

FIG. 4 is a block diagram of an embodiment of a voting system that can be used in the embodiments of FIGS. 1A, 2, and 3. The voting system 161 includes a counter 441, a flip-flop 421, and an AND gate 431. By way of example, the counter 441 has flip-flops 423–425. Although flip-flops are shown, any counter can be used.

As described above, the voting system 161 evaluates the outputs of the sensing device 114 (FIGS. 1A, 2, and 3) stored in the storage device 151 to determine whether there is a consensus or whether there is a majority. The voting system 161 evaluates the outputs by first obtaining the outputs from the storage device 151, and then counting the number of data "1"'s in a string of data. If each data in the string is a data "1", there is a consensus. If a majority of data in the string is a data "1", there is a majority. Alternatively, the voting system 161 can count the number of data "0"'s in the string to determine whether there is a consensus or whether there is a majority.

The storage device 151 stores the outputs of the sensing device 114 and outputs a string of data in a serial format over a line 417. The number of bits in the string correspond to the number of outputs of the sensing device 114. For instance, the string over the line 417 has seven bits if the sensing device 114 provides seven outputs.

The counter 441 receives the string of data, counts the number of data "1"'s in the string, and outputs the count to the node 171. For instance, if the string of data has four data "1"'s, the counter 441 outputs a "100" in binary. Alternatively, if the string of data has six data "1"'s, the counter 441 outputs a "110" in binary.

The flip-flops 421, 423, and the AND gate 431 provide alternatives to looking at the node 171 to obtain the result of the voting system 171. The flip-flop 421 receives the string of data and does not toggle its output over a line 427 until it receives a data "1" in the string. Hence, if the output of the flip-flop 421 over the line 427 does not toggle, the string is a "0000000", which means that there is a consensus, i.e., each of the outputs of the sensing device 114 is a data "0". In such a case, there is no reason to look at the node 171 since no toggle over the line 427 indicates that each of the outputs of the sensing device 114 is a data "0". However, if the output of the flip-flop 421 toggles, the string of data has at least one data "1", and there may be a consensus if each of the outputs of the sensing device 114 is a data "1". In such a case, result at the node 171 is important since it indicates a result of the evaluation by the voting system 161.

If the output of the AND gate 431 is high, output of each of the flip-flops 423–425 is a "1", which means that the string of data over the line 417 is "1111111", thereby indicating a consensus, i.e., each of the outputs of the sensing device 114 is a, data "1". In such a case, there is no need to look at the node 171 to obtain the result at the node 171 of the voting system 161 since it is known from the output of the AND gate 431 that each of the output of the sensing device 114 is a data "1". Alternatively, if output of the flip-flop 423 is a 1, a majority of data in the string is data "1" and if the output of the flip-flop 423 is a 0, a majority of data in the string of data is data "0".

A clock signal is provided via a line 415 to the counter 441 and via a line 419 to the flip-flop 421. It should be noted that the voting system 161 need not include the flip-flop 421 and the AND gate 431. However, the flip-flop 421 and the AND gate 431 provide added convenience in that the result at the node 171 need not be checked to obtain the output the voting system 161.

Figure 5A:
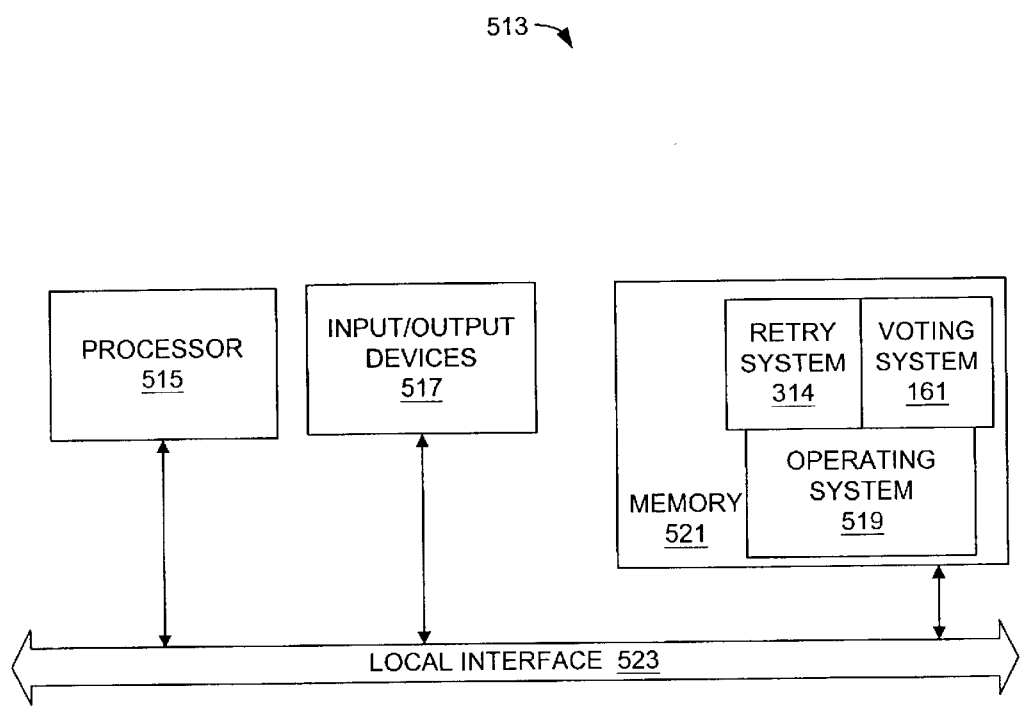
FIG. 5A is a block diagram of still another embodiment of a system for reducing the effect of noise, where the embodiment is a computer that includes the voting system and a retry system.

FIG. 5A is a block diagram of still another embodiment of a noise-reducing system 513. The noise-reducing system 513 is a computer that includes the retry system 314 (FIG.

3), and the voting system 161 (FIGS. 1A, 2, and 3). Normally, however, the noise-reducing system 513 will include either the retry system 314 or the voting system 161, but not both. Generally, in terms of hardware architecture, the noise-reducing system 513 includes a processor 515, a memory 521, and one or more input or output (I/O) devices 517 that are communicatively coupled via a local interface 523. The local interface 523 can be, for example, one or more buses or other wired or wireless connections. The local interface 523 may have additional elements, which are omitted for simplicity, such as controllers, buffers, drivers, repeaters, and receivers, to enable communications. Further, the local interface 523 may include address, control, and/or data connections to enable appropriate communications among the aforementioned components.

The processor 515 is a hardware device for executing software, particularly that stored in memory 521. The processor 515 can be any custom made or commercially available processor, a central processing unit (CPU), an auxiliary processor among several processors associated with the noise-reducing system 513, a semiconductor based microprocessor in the form of a microchip or chip set, a macroprocessor, or generally any device for executing software instructions.

The memory 521 can include any one or combination of volatile memory cells such as random access memory (RAM) and nonvolatile memory cells such as read-only memory (ROM), hard drive, tape, and Compact Disc ROM (CDROM). Different types of RAM are dynamic RAM (DRAM), static RAM (SRAM), MRAM, and synchronous DRAM (SDRAM). Moreover, the memory 521 may incorporate electronic, magnetic, optical, and/or other types of storage media. Note that the memory 521 can have a distributed architecture, where various components are situated remote from one another, but can be accessed by the processor 515.

The software in memory 521 may include one or more separate programs, each of which includes an ordered listing of executable instructions for implementing logical functions. In the embodiment of the noise-reducing system 513 of FIG. 5A, the software in the memory 521 includes the voting system 161, the retry system 314, and a suitable operating system (O/S) 519. The O/S 519 essentially controls the execution of other computer programs, such as the retry system 314, and provides scheduling, input-output control, file and data management, memory management, and communication control and related services.

Each of the voting system 161 and the retry system 314 can be a source program, executable program, script, or any other entity comprising a set of instructions to be performed. When the voting system 161 or the retry system 314 is a source program, the program needs to be translated via a compiler, assembler, interpreter, or the like, which may or may not be included within the memory 521, so as to operate properly in connection with the O/S 519. Furthermore, each of the voting system 161 and the retry system 314 can be written as (a) an object oriented programming language, which has classes of data and methods, or (b) a procedural programming language, which has routines, subroutines, and/or functions, for example but not limited to, C, C++, Pascal, Basic, Fortran, Cobol, Perl, Java, and Ada.

The I/O devices 517 may include input devices, for example, but not limited to, a keyboard, mouse, scanner, and a microphone. Furthermore, the I/O devices 517 may also include output devices, for example, a printer, and a display. Finally, the I/O devices 517 may further include devices that communicate both inputs and outputs, for instance, a modem for accessing another device, system, or network, a radio frequency (RF) or other transceiver, a telephonic interface, a bridge, and a router.

If the noise-reducing system 513 is a PC, workstation, or the like, the software in the memory 521 may further include a basic input output system (BIOS) (omitted for simplicity). The BIOS is a set of essential software routines that initialize and test hardware at startup, start the O/S 519, and support the transfer of data among the hardware devices. The BIOS is stored in ROM so that the BIOS can be executed when the noise-reducing system 513 is activated.

When the noise-reducing system 513 is in operation, the processor 515 is configured to execute software stored within the memory 521, to communicate data to and from the memory 521, and to generally control operations of the noise-reducing system 513 pursuant to the software. The voting system 161, the retry system 314, and the O/S 519, in whole or in part, but typically the latter, are read by the processor 515, perhaps buffered within the processor 515, and then executed.

An alternative embodiment of the retry system 314 is implemented in hardware. In such an embodiment, the retry system 314 is implemented with any or a combination of the following technologies, which are each well known in the art: a discrete logic circuit(s) having logic gates for implementing logic functions upon data signals, an application specific integrated circuit (ASIC) having appropriate combinational logic gates, programmable gate arrays (PGAs), and field programmable gate arrays.

Figure 5B:
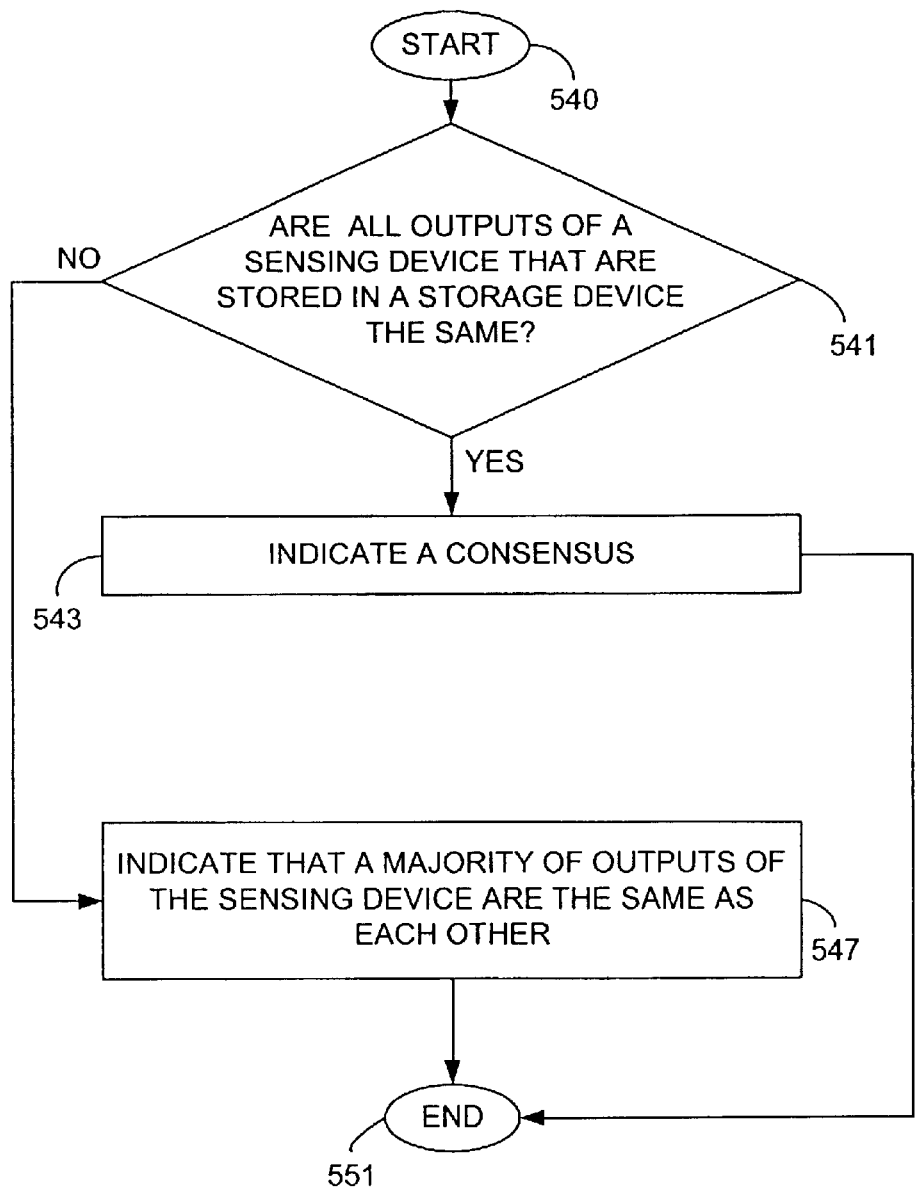
FIG. 5B is a flowchart of an embodiment of a method for evaluating outputs of sensing devices shown in FIGS. 1A and 2–4.

FIG. 5B is a flowchart of an embodiment of a method for evaluating outputs of the sensing device 114 shown in FIGS. 1A, 2, and 3. The outputs are evaluated to determine whether there is a consensus or a majority. Any process descriptions or blocks in any flow chart should be understood as representing modules, segments, or portions of code which include one or more executable instructions for implementing specific logical functions or steps in a method, and alternate implementations are included within the scope of the preferred embodiment of the present invention in which functions may be executed out of order from that shown or discussed, including substantially concurrently or in reverse order, depending on the functionality involved, as would be understood by those skilled in the art of the present invention.

The method starts with step 540 and in step 541, there is a determination as to whether each of the outputs of the sensing device 114 is the same as each other. To determine whether each of the outputs of the sensing device 114 is the same as each other, the voting system 161, for instance, counts the number of data "1"'s in the outputs of the sensing device 114. In step 543, the voting system 161 commands the I/O devices 517 to indicate a consensus if each of the outputs is a data "1". Alternatively, there is a consensus if each of the outputs of the sensing device 114 is a data "0".

If outputs of the sensing device 114 are not the same as each other, a majority of the outputs of the sensing device 114 are the same as each other and the flow continues to step 547. In step 547, the voting system 161 commands the I/O devices 517 to indicate that a majority of the outputs of the sensing device 114 are the same as each other. The indication is made, after counting, for instance, the number of data "1"'s in the outputs of the sensing device 114. Alternatively, the indication can be made after counting the number of data "0"'s in the string. The method ends in step 551 after steps 543 and 547.

Figure 5C:
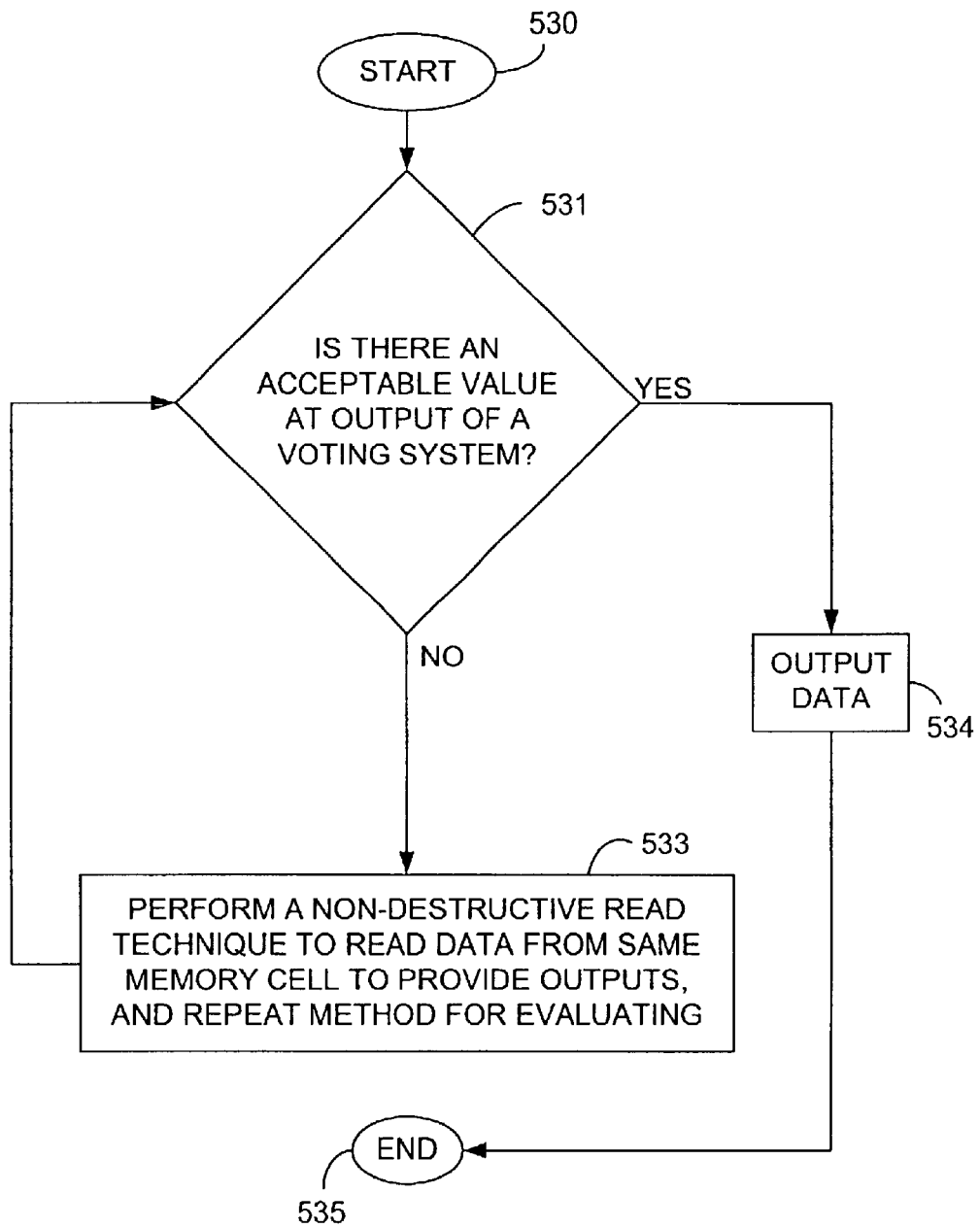
FIG. 5C is a flowchart of an embodiment of a method for retrying.

FIG. 5C is a flowchart of an embodiment of a method for retrying. The method starts in step 530. In step 531, the retry system 314 analyzes whether the result of the voting system 161 at the node 171, or indicated by the I/O devices 517, is of an acceptable value. In step 533, if the value at the node 171 or indicated by the I/O devices 517 is not acceptable, the sensing device 114 performs a non-destructive read technique to read data from the memory cell that was read to provide the result at the node 171. The voting system 161 then repeats the method for evaluating. For instance, if the value is not acceptable the sensing device 114 performs a non-destructive read technique to read data from the memory cell. The sensing device 114 provides outputs to the voting system 161. The voting system 161 provides a result based on an evaluation of the outputs of the sensing device 114. The evaluation was described above. The method then repeats the step 531. The method for retrying continues to repeat until result at the node 171 or indicated by the 110 devices 517 is of an acceptable value. If the result of the voting system 161 at the node 171 is of an acceptable value, data output by all or alternatively, a majority of the outputs of the sensing device 114 is output over the line 181 (FIG. 3) in step 534. The method then ends in step 535.

Figure 6:
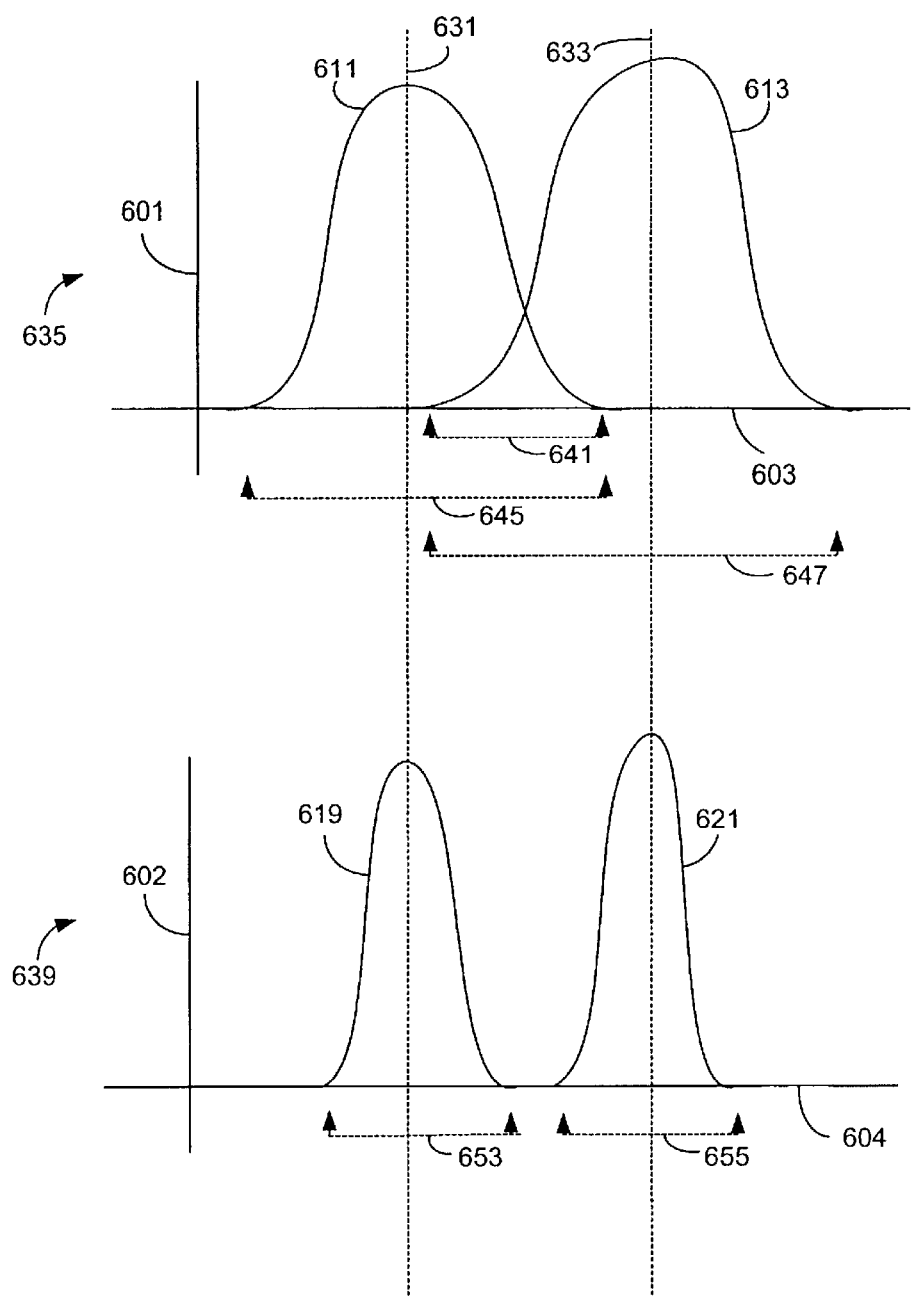
FIG. 6 is a graphical representation illustrating the effect of the systems and methods for reducing the effect of noise while reading data in series from a magneto-resistive device.

FIG. 6 is a graphical representation illustrating the effect of the systems and methods for reducing the effect of noise while reading data in series from a memory cell. The systems and methods for reducing the effect of noise essentially execute a process of obtaining small set average values from sense values to reduce the effect of noise. The systems and methods essentially execute the process since the sensing device reads data from a memory cell multiple times to provide outputs. The systems can also essentially execute the process by executing the methods multiple times, thereby reading data from a memory cell multiple times and evaluating the data multiple times. The process of obtaining small set average values reduces the effect of noise since the range of variations of noise observed in a small set average value is lesser than the maximum variation of noise seen in a sense value. The range of variations is lesser since a small set average value is a ratio of a sum of sense values obtained by the sensing device and the number of sense values. The sense value is a value of data that is read by the sensing device 114 (FIG. 1A) from the memory cell 103 (FIG. 1A). Hence, the systems and methods for reducing the effect of noise, which essentially obtain small set average values, will yield results with a smaller range of noise than a system and method based on simply obtaining a single sense value.

Graph 635 is a set of two distribution curves that show a probability of a sense value versus the magnitude of the sense value. The probability is measured along an axis 601 and the magnitude is measured along an axis 603. The curve 611 represents a memory cell in a parallel state, when the memory cell offers low resistance to a current passing through the cell. For instance, the curve 611 represents a memory cell that stores a data "0". The curve 613 represents a memory cell in an anti-parallel state, when the memory cell offers a high resistance to a current passing through the cell. For instance, the curve 613 represents a memory cell that stores a data "1". Line 631 represents a median of all values of the curve 611, which means that half of the values of the curve 611 are below the line 631 and the rest half are above. Similarly, line 633 represents a median of all values of the curve 613, which means that half of the values of the curve 613 are below the line 633 and the rest half are above. Ranges 645 and 647 of the distribution curves 611 and 613, respectively, indicate a measure of noise associated with sensing values from the memory cell. The reason for the shape of the distribution curves is variations from one sense value to another. The variations in the sense value are due to variations in noise in the sensing device 114. When the distribution curves 611 and 613 overlap as indicated by a range 641, obtaining a single sense value may not yield a reliable result if the sense value of the memory cell falls into the region 641. Graph 635 represents a system and method with a low Signal-to-Noise ratio (SNR) less than 1. Signal is the difference between the average values 631 and 633, and noise is the range values 645 and 647.

One objective of the systems and methods for reducing the effect of noise is to reduce the range 641, thereby reducing the probability of an unreliable result that falls in the range 641. Graph 639 is a set of distribution curves showing a probability of a small set average value versus the magnitude of the small set average value. The probability is measured along an axis 602 and the magnitude is measured along an axis 604. A small set average value is defined as a ratio of a sum of sense values obtained by the sensing device 114 and the number of sense values that are obtained. For instance, if the sensing device 114 reads data from the memory cell 103 seven times to provide outputs, the small set average value in FIG. 1 is defined by a ratio of sum of values of data read by the sensing device 114 and 7, which is the number of times the data was read. Line 631 represents a median of all values of the curve 619, and line 633 represents a median of values of the curve 621. Ranges 653 and 655 of the small set average values decrease as the number of times the sensing device 114 reads data from the memory cell 103 increases. When a small set average value includes enough samples, a range can be reduced so that there is no overlap in the distribution curves 619 and 621. When there is no overlap between the distribution curves, there will be no uncertainty of the sense value representing a data "0" or a data "1". Graph 639 represents the systems and methods for reducing the effect of noise with an SNR greater than 1. The signal of the SNR is the difference between the average values 631 and 633 and noise is the range values 653 and 655. Hence, as shown in 639, if the systems and methods for reducing noise are used, the effect of noise represented in graph 635 with a SNR less than 1 can be reduced so that the SNR is greater than 1. It should be noted that the distribution curves in FIG. 6 are smooth and represent a very large number, approximately in the range of 100 to 10,000, of sense values of a memory cell.

It should be emphasized that the above-described embodiments of the present invention, particularly, any "preferred" embodiments, are merely possible examples of implementations, merely set forth for a clear understanding of the principles of the invention. Many variations and modifications may be made to the above-described embodiment(s) of the invention without departing substantially from the spirit and principles of the invention. All such modifications and variations are intended to be included herein within the scope of this disclosure and the present invention and protected by the following claims.

What is claimed is:

1. A system for reducing the effect of noise while reading data in series from memory, comprising:
   a memory cell that stores a first data;
   a sensing device that receives the first data multiple times and provides a first set of outputs; and
   a voting system that evaluates the first set of outputs to determine whether one of the outputs of the first set is valid data from the memory cell;
   wherein a storage device is configured to store the first set of outputs after the sensing device provides the first set of outputs and before the voting system evaluates the first set of outputs.

2. A system for reducing the effect of noise while reading data in series from memory, comprising:
- a memory cell that stores a first data;
- a sensing device that receives the first data multiple times and provides a first set of outputs; and
- a voting system that evaluates the first set of outputs to determine whether one of the outputs of the first set is valid data from the memory cell; and
- a retry system that determines whether to command a controller, wherein if the retry system determines to command, the controller instructs to repeat to obtain the first data from the memory cell to provide a second set of outputs and to evaluate the second set of outputs.

3. A system for reducing the effect of noise while reading data in series from memory, comprising:
- a memory cell that stores a first data;
- a sensing device that receives the first data multiple times and provides a first set of outputs; and
- a voting system that evaluates the first set of outputs to determine whether one of the outputs of the first set is valid data from the memory cell;
- wherein the voting system is a voting system that evaluates the first set of outputs to provide one of the outputs of the first set if the outputs of the first set are the same as each other.

4. A system for reducing the effect of noise while reading data in series from memory, comprising:
- a memory cell that stores a first data;
- a sensing device that receives the first data multiple times and provides a first set of outputs; and
- a voting system that evaluates the first set of outputs to determine whether one of the outputs of the first set is valid data from the memory cell;
- wherein the voting system is a voting system that evaluates the first set of outputs to determine whether to provide one of a majority of the outputs of the first set that are the same as each other, and wherein the voting system determines whether to provide based on a context of the first data.

5. A system for reducing the effect of noise while reading data in series from memory, comprising:
- a memory cell that stores a first data;
- a sensing device that receives the first data multiple times and provides a first set of outputs; and
- a voting system that evaluates the first set of outputs to determine whether one of the outputs of the first set is valid data from the memory cell; and
- a retry system that determines whether to command the sensing device to again obtain the first data from the memory cell to provide a second set of outputs, wherein the voting system evaluates the outputs of the second set if the sensing device again obtains the first data from the memory cell.

6. The noise-reducing system of claim 5, wherein the retry system is configured to command the sensing device to again obtain the first data if the voting system evaluates the first set of outputs and provides a value that is not acceptable.

7. The noise-reducing system of claim 6, wherein the retry system is a retry system that commands the sensing device to again obtain the first data, if the voting system evaluates the first set of outputs and provides a value that does not correspond to all the outputs of the first set being the same as each other.

8. The noise-reducing system of claim 7, wherein the retry system is a retry system that commands the sensing device to again obtain the first data, if the voting system evaluates the first set of outputs and provides a value that does not correspond to a majority of the outputs of the first set being the same as each other, and wherein the voting system evaluates the first set of outputs and may provide a value that does not correspond to a majority of the outputs of the first set being the same as each other depending on a context of the first data.

9. A system for reducing the effect of noise while reading data in series from memory, comprising:
- a memory cell that stores a first data;
- a sensing device that receives the first data multiple times and provides a first set of outputs; and
- a voting system that evaluates the first set of outputs to determine whether one of the outputs of the first set is valid data from the memory cell;
- wherein the voting system comprises a counter that counts a number of the outputs of the first set that are the same as each other, thereby evaluating the outputs of the first set to determine whether one of the outputs of the first set is valid data from the memory cell.

10. The noise-reducing system of claim 9, wherein the voting system further comprises a flip-flop and an AND gate, both the flip-flop and the AND gate configured to indicate whether all the outputs of the first set are the same as each other.

11. A method for reducing the effect of noise while reading data in series from memory, comprising:
- reading data, in series, that is stored in a memory cell to provide outputs; and
- evaluating the outputs to determine whether one of the outputs is valid data from the memory cell; and
- storing the outputs before the step of evaluating and after the step of reading.

12. A method for reducing the effect of noise while reading data in series from memory, comprising:
- reading data, in series, that is stored in a memory cell to provide outputs; and
- evaluating the outputs to determine whether one of the outputs is valid data from the memory cell;
- wherein the evaluating comprises:
  - analyzing the outputs to determine whether the outputs are the same as each other; and determining that one of the outputs is the valid data if the outputs are the same as each other.

13. A method for reducing the effect of noise while reading data in series from memory, comprising:
- reading data, in series, that is stored in a memory cell to provide outputs; and
- evaluating the outputs to determine whether one of the outputs is valid data from the memory cell;
- wherein the evaluating comprises:
  - analyzing the outputs to determine whether a majority of the outputs are the same as each other; and
  - determining whether one of the majority of the outputs is valid data based on a context of the data stored in the memory cell.

14. A method for reducing the effect of noise while reading data in series from memory, comprising:
- reading data, in series, that is stored in a memory cell to provide outputs; and
- evaluating the outputs to determine whether one of the outputs is valid data from the memory cell;

wherein the reading step comprises at least one of a triple sample technique, a non-destructive read technique, a technique using a differential sense amplifier, and a bit-bit bar sense scheme.

15. A method for reducing the effect of noise while reading data in series from memory, comprising:
   reading data, in series, that is stored in a memory cell to provide outputs; and
   evaluating the outputs to determine whether one of the outputs is valid data from the memory cell; and
   repeating the reading and the evaluating steps until an acceptable value is obtained.

16. The method of claim 15, wherein the step of reading is repeated using a non-destructive read technique.

17. The method of claim 16, wherein the step of repeating comprises repeating the reading and the evaluating until a value that corresponds to the outputs being the same as each other is obtained.

18. The method of claim 16, wherein the step of repeating comprises repeating the reading and the evaluating until a value that may correspond to a majority of the outputs being the same as each other depending on a context of the data stored in the memory cell is obtained.

19. A system for reducing the effect of noise while reading data in series from memory, comprising:
   means for reading data, in series, that is stored in a memory cell to provide outputs;
   means for evaluating the outputs to determine whether one of the outputs is valid data from the memory cell; and
   means for storing the outputs before evaluating and after reading.

20. A system for reducing the effect of noise while reading data in series from memory, comprising:
   means for reading data, in series, that is stored in a memory cell to provide outputs; and
   means for evaluating the outputs to determine whether one of the outputs is valid data from the memory cell;
   wherein the means for evaluating comprises means for evaluating the outputs to provide one of the outputs if the outputs are the same as each other.

21. A system for reducing the effect of noise while reading data in series from memory, comprising:
   means for reading data, in series, that is stored in a memory cell to provide outputs; and
   means for evaluating the outputs to determine whether one of the outputs is valid data from the memory cell;
   wherein the means for evaluating comprises means for evaluating the outputs to determine whether to provide one of a majority of the outputs of the first set that are the same as each other, and wherein the means for evaluating is configured to determine whether to provide based on a context of the data stored in the memory cell.

22. A system for reducing the effect of noise while reading data in series from memory, comprising:
   means for reading, data in series, that is stored in a memory cell to provide outputs; and
   means for evaluating the outputs to determine whether one of the outputs is valid data from the memory cell; and
   means for repeating the reading and the evaluating until the means for evaluating provides an acceptable value.

23. The noise-reducing system of claim 22, wherein the means for repeating comprises a means for repeating the use of the means for reading and of the means for evaluating until the means for evaluating provides a value that corresponds to all of the outputs being the same as each other.

24. The noise-reducing system of claim 22, wherein the means for repeating comprises a means for repeating the use of the means for reading and of the means for evaluating until the means for evaluating provides a value that may correspond to a majority of the outputs being the same as each other depending on a context of the data stored in the memory cell.

* * * * *